(12) United States Patent
Yeo et al.

(10) Patent No.: US 7,314,795 B2
(45) Date of Patent: Jan. 1, 2008

(54) METHODS OF FORMING ELECTRONIC DEVICES INCLUDING ELECTRODES WITH INSULATING SPACERS THEREON

(75) Inventors: In-joon Yeo, Gyeonggi-Do (KR); Tae-hyuk Ahn, Gyeonggi-Do (KR); Kwang-wook Lee, Gyeonggi-Do (KR); Jung-woo Seo, Gyeonggi-Do (KR); Jeong-sic Jeon, Gyeonggi-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 73 days.

(21) Appl. No.: 11/397,541

(22) Filed: Apr. 4, 2006

(65) Prior Publication Data

US 2006/0180843 A1 Aug. 17, 2006

Related U.S. Application Data

(62) Division of application No. 10/796,931, filed on Mar. 10, 2004, now Pat. No. 7,053,435.

(30) Foreign Application Priority Data

Nov. 17, 2003 (KR) .................................. 03-81099

(51) Int. Cl.
H01L 21/8243 (2006.01)
H01L 21/8244 (2006.01)
H01L 21/8242 (2006.01)
H01L 21/20 (2006.01)

(52) U.S. Cl. ...................... 438/239; 438/238; 438/398; 438/253; 257/E21.019; 257/E21.013; 257/E21.649

(58) Field of Classification Search ................ 438/238, 438/239, 398, 253; 257/E21.019, E21.013, 257/E21.649
See application file for complete search history.

(56) References Cited

U.S. PATENT DOCUMENTS

| 5,330,614 A | 7/1994 | Ahn |
| 5,753,949 A | 5/1998 | Honma et al. |
| 5,824,592 A | 10/1998 | Tseng |
| 5,946,571 A | 8/1999 | Hsue et al. |
| 6,008,514 A | 12/1999 | Wu |
| 6,025,246 A | 2/2000 | Kim |

(Continued)

FOREIGN PATENT DOCUMENTS

KR 1020010083563 9/2001

OTHER PUBLICATIONS

Korean Office Action.

(Continued)

Primary Examiner—Michael Lebentritt
Assistant Examiner—Mohsen Ahmadi
(74) Attorney, Agent, or Firm—Myers Bigel Sibley & Sajovec

(57) ABSTRACT

An electronic device may include a substrate, a conductive layer on the substrate, and an insulating spacer. The conductive electrode may have an electrode wall extending away from the substrate. The insulating spacer may be provided on the electrode wall with portions of the electrode wall being free of the insulating spacer between the substrate and the insulating spacer. Related methods and structures are also discussed.

39 Claims, 10 Drawing Sheets

U.S. PATENT DOCUMENTS

| | | |
|---|---|---|
| 6,156,608 A | 12/2000 | Chen |
| 6,303,956 B1 | 10/2001 | Sandhu et al. |
| 6,395,600 B1 | 5/2002 | Durcan et al. |
| 6,403,418 B2 | 6/2002 | Wang et al. |
| 6,403,442 B1 * | 6/2002 | Reinberg .................... 438/396 |
| 6,489,195 B1 | 12/2002 | Hwang et al. |
| 6,563,190 B1 | 5/2003 | Lee et al. |
| 6,617,222 B1 * | 9/2003 | Coursey ..................... 438/398 |
| 6,667,502 B1 | 12/2003 | Agarwal et al. |
| 2003/0227044 A1 * | 12/2003 | Park ........................... 257/301 |

OTHER PUBLICATIONS

English Translation of Korean Office Action.

* cited by examiner

METHODS OF FORMING ELECTRONIC DEVICES INCLUDING ELECTRODES WITH INSULATING SPACERS THEREON

RELATED APPLICATIONS

The present application claims the benefit of priority as a divisional of U.S. application Ser. No. 10/796,931 filed Mar. 10, 2004, now U.S. Pat. No. 7,053,435 which claims the benefit of priority from Korean Application No. P2003-0081099 filed Nov. 17, 2003. The disclosures of each of the above referenced applications are hereby incorporated herein in their entirety by reference.

FIELD OF THE INVENTION

The present invention relates to the field of electronics and more particularly to electrodes for electronic devices and related methods.

BACKGROUND

As dynamic random access memory (DRAM) devices become more highly integrated, the area available for each memory cell is reduced. Accordingly, the substrate area available for each memory cell capacitor may be reduced so that it may be difficult to maintain a desired memory cell capacitance as integration densities increase. Reduced memory cell capacitances may increase a soft error rate (SER), degrade memory cell operation at low voltages, and/or result in more frequent memory refresh operations. Accordingly, there exists a need to provide a memory cell capacitor occupying a reduced surface area of the memory device substrate while maintaining a desired capacitance.

In response, capacitors having three-dimensional structures have been proposed to increase the surface area of the capacitor electrodes thereby increasing the capacitance of the resulting capacitor. In particular, cylindrical electrode structures may be used where inner and outer surfaces of a cylinder are used to increase an effective capacitor electrode area. A surface area of a cylindrical capacitor electrode structure may be further increased by increasing a height of the structure.

A cylindrical electrode structure may be formed, for example, as shown in FIGS. 6A-B. As shown in FIG. 6A, an insulating layer 701 and an etch stopping layer 703 may be formed on a substrate 700, and conductive plugs 702 may provide electrical coupling through the etch stopping and insulating layers 703 and 701. A first sacrificial layer 704 may be formed on the etch stopping layer 703, and holes through the first sacrificial layer 704 may expose the conductive plugs 702. Cylindrical electrodes 705 may be formed on sidewalls of the holes in the first sacrificial layer 704, and a second sacrificial layer 706 may be provided within the cylindrical electrodes.

The sacrificial layers 704 and 706 may be removed as shown in FIG. 6B so that inside and outside surfaces of the cylindrical electrodes 705 are exposed, and a capacitor dielectric layer and a second capacitor electrode may be formed on the exposed surfaces of the cylindrical electrodes 705. With relatively tall and/or closely packed cylindrical electrode structures, however, adjacent cylindrical electrodes may lean together once the support provided by the sacrificial layers is removed. As shown in FIG. 6B, an electrical short may thus result between adjacent cylindrical electrodes at 707 prior to forming a capacitor dielectric layer. For example, cylindrical electrodes may lean together while being cleaned and/or dried after removing the sacrificial layers.

SUMMARY

According to embodiments of the present invention, an electronic device may include a substrate, a conductive electrode on the substrate, and a conductive spacer. The conductive electrode may have an electrode wall extending away from the substrate, and the insulating spacer may be on the electrode wall with portions of the electrode wall being free of the insulating spacer between the substrate and the insulating spacer. In addition, portions of the electrode wall may extend from the insulating spacer away from the substrate free of the insulating spacer, and/or the electrode wall may include a recessed portion with the insulating spacer being on the recessed portion of the electrode wall.

Moreover, the electrode wall may be closed thereby defining an inside of the electrode wall and an outside of the electrode wall. For example, the electrode wall may define a cylinder. The device may also include a capacitor dielectric layer on portions of the conductive electrode free of the spacer, and a second conductive electrode on the capacitor dielectric layer opposite the first electrode. The spacer may have a first thickness separating the conductive electrodes, and the capacitor dielectric layer may have a second thickness separating the conductive electrodes with the first thickness being greater than the second thickness.

The substrate may also include a memory cell access transistor, and the conductive electrode may be electrically coupled with a source/drain region of the memory cell access transistor. In addition, a sacrificial layer may have a thickness on the substrate such that the sacrificial layer extends to the insulating spacer, and the sacrificial layer and the insulating spacer may comprise different materials.

According to additional embodiments of the present invention, a conductive electrode may be formed on a substrate, and the conductive electrode may include an electrode wall extending away from the substrate. An insulating spacer may be formed on the electrode wall wherein portions of the electrode wall are free of the insulating spacer between the substrate and the insulating spacer. In addition, portions of the electrode wall may extend from the insulating spacer away from the substrate free of the insulating spacer.

The electrode wall may also include a recessed portion, and the insulating spacer may be formed on the recessed portion of the electrode wall. Moreover, the recessed portion of the electrode wall may extend from the insulating spacer away from the substrate free of the insulating spacer.

A capacitor dielectric layer may also be formed on portions of the conductive electrode free of the spacer, and a second conductive electrode may be formed on the capacitor dielectric layer opposite the first electrode. More particularly, the spacer may have a first thickness separating the conductive electrodes, the capacitor dielectric layer may have a second thickness separating the conductive electrodes, and the first thickness may be greater than the second thickness. The electrode wall may be closed thereby defining an inside of the wall and an outside of the electrode wall. For example, the electrode wall may define a cylinder.

In addition, a sacrificial layer having a hole therein may be formed on the substrate, and forming the conductive electrode may include forming the electrode wall on a sidewall of the hole in the sacrificial layer. Portions of the sacrificial layer may be removed to expose a portion of the electrode wall while maintaining a portion of the sacrificial layer between the exposed portion of the electrode wall and the substrate. More particularly, the sacrificial layer and the insulating spacer may comprise different materials, and forming the insulating spacer may include forming the insulating spacer on the exposed portion of the electrode wall. Moreover, portions of the sacrificial layer between the insulating spacer and the substrate may be removed after forming the insulating spacer. Removing a portion of the sacrificial layer may include removing at least approximately 200 Å of the sacrificial layer, and at least approximately 10,000 Å of the sacrificial layer may remain after removing at least approximately 200 Å of the sacrificial layer. Accordingly, a length of portions of the electrode between the substrate and the insulating spacer may be at least approximately 10,000 Å.

The substrate may include a memory cell access transistor, and the conductive electrode may be electrically coupled with a source/drain region of the memory cell access transistor. In addition, a sacrificial layer may be formed on the substrate such that the sacrificial layer extends to the insulating spacer, and the sacrificial layer and the insulating spacer may comprise different materials.

According to still additional embodiments of the present invention, an electronic device may include a substrate and a conductive electrode on the substrate. More particularly, the conductive electrode may include an electrode wall extending away from the substrate, and the electrode wall may include a recessed portion at an end thereof opposite the substrate. In addition, an insulating spacer may be provided on the recessed portion of the electrode wall with portions of the electrode wall being free of the insulating spacer between the substrate and the insulating spacer, and portions of the electrode wall may extend from the insulating spacer away from the substrate free of the insulating spacer.

The electrode wall may be closed thereby defining an inside of the electrode wall and an outside of the electrode wall. For example, the electrode wall may define a cylinder. In addition, a capacitor dielectric layer may be provided on portions of the conductive electrode, and a second conductive electrode may be provided on the capacitor dielectric layer opposite the first electrode. An insulating spacer may also be provided on the recessed portion of the electrode wall such that portions of the electrode wall are free of the insulating spacer between the substrate and the insulating spacer. Moreover, the spacer may have a first thickness separating the conductive electrodes, the capacitor dielectric layer may have a second thickness separating the conductive electrodes, and the first thickness may be greater than the second thickness.

The substrate may also include a memory cell access transistor, and the conductive electrode may be electrically coupled with a source/drain region of the memory cell access transistor. A sacrificial layer on the substrate may have a thickness such that the sacrificial layer extends to the recessed portion of the electrode wall, and the recessed portion of the electrode wall may be free of the sacrificial layer.

According to yet additional embodiments of the present invention, a method of forming an electronic device may include forming a conductive electrode on a substrate, and the conductive electrode may have an electrode wall extending away from the substrate. A recessed portion may be formed at an end of the electrode wall opposite the substrate. Moreover, an insulating spacer may be formed on the recessed portion of the electrode wall, and portions of the electrode wall may be free of the insulating spacer between the substrate and the insulating spacer. In addition, portions of the electrode wall may extend from the insulating spacer away from the substrate free of the insulating spacer. More particularly, the recessed portion of the electrode wall may extend from the insulating spacer away from the substrate free of the insulating spacer.

A capacitor dielectric layer may be formed on portions of the conductive electrode, and a second conductive electrode may be formed on the capacitor dielectric layer opposite the first electrode. In addition, an insulating spacer may be formed on the recessed portion of the electrode wall with portions of the electrode wall being free of the insulating spacer between the substrate and the insulating spacer. More particularly, the spacer may have a first thickness separating the conductive electrodes, the capacitor dielectric layer may have a second thickness separating the conductive electrodes, and the first thickness may be greater than the second thickness. The electrode wall may be closed thereby defining an inside of the wall and an outside of the electrode wall. For example, the electrode wall may define a cylinder.

A sacrificial layer having a hole therein may be formed on the substrate, and forming the conductive electrode may include forming the electrode wall on a sidewall of the hole in the sacrificial layer. In addition, a portion of the sacrificial layer may be removed before forming the recessed portion of the electrode wall to expose a portion of the electrode wall while maintaining a portion of the sacrificial layer between the exposed portion of the electrode wall and the substrate. More particularly, forming the recessed portion of the electrode wall may include forming the recessed portion of the electrode wall at portions of the electrode wall exposed by the sacrificial layer. An insulating spacer may also be formed on the recessed portion of the electrode wall wherein the sacrificial layer and the insulating spacer comprise different materials.

After forming the recessed portions of the electrode wall, a portion of the sacrificial layer between the recessed portions of the electrode wall and the substrate may be removed. Moreover, removing a portion of the sacrificial layer may include removing at least approximately 200 Å of the sacrificial layer. More particularly, at least approximately 10,000 Å of the sacrificial layer may remain after removing at least approximately 200 Å of the sacrificial layer.

A length of portions of the electrode wall between the substrate and the recessed portion may be at least approximately 10,000 Å. In addition, the substrate may include a memory cell access transistor, and the conductive electrode may be electrically coupled with a source/drain region of the memory cell access transistor.

DETAILED DESCRIPTION

Figure 1:
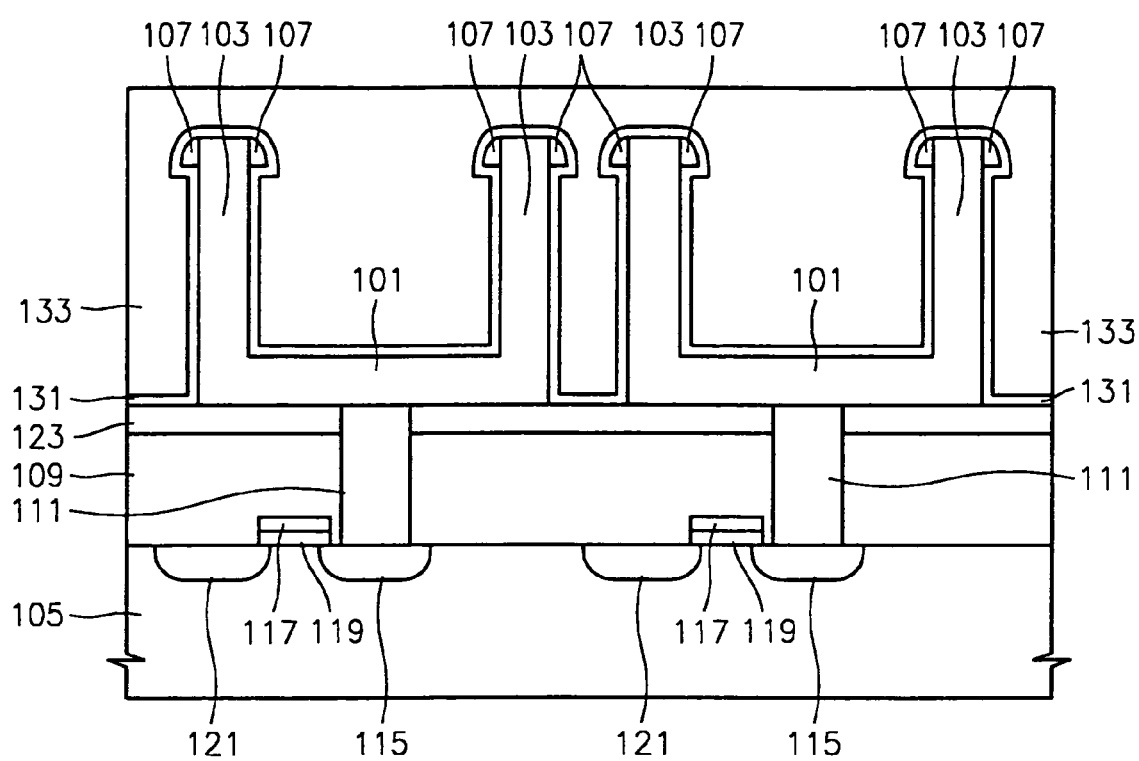
FIG. 1 is a cross-sectional view of memory devices including capacitor electrodes according to embodiments of the present invention.

The present invention will now be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the size and the thickness of layers and regions are exaggerated for clarity. It will also be understood that when a layer is referred to as being on another layer or substrate, it can be directly on the other layer or substrate, or intervening layers may also be present. It will also be understood that when a layer or element is referred to as being connected to or coupled to another layer or element, it can be directly connected to or coupled to the other layer or element, or intervening layers or elements may also be present.

According to embodiments of the present invention, an electronic device may include electrodes 101 having electrode walls 103 extending from a substrate 105 (such as a silicon substrate). In addition, insulating spacers 107 (such as silicon nitride and/or silicon oxynitride spacers) may be provided on the electrode walls 103 such that portions of the electrode walls are free of the insulating spacers 107 between the substrate 105 and the insulating spacers 107. More particularly, an insulating layer 109 (such as a silicon oxide layer) may be provided between the capacitor electrodes 101 and the substrate 105, and conductive plugs 111 (such as doped polysilicon plugs) may provide electrical coupling between the capacitor electrodes 101 and a surface of the substrate 105.

By way of example, the capacitor electrodes 101 may be first electrodes of storage capacitors for a dynamic random access memory device. Moreover, the conductive plugs 111 may provide electrical connection between the electrodes 101 and source/drain regions 115 of memory cell access transistors. The memory cell access transistors may also include gate electrodes 117, gate dielectric layers 119, and second source/drain regions 121 (which may be coupled to a bit line(s) not illustrated in FIG. 1). In addition, a capacitor dielectric layer(s) 131 may be provided on the first capacitor electrodes 101, and second capacitor electrode(s) 133 may be provided on the capacitor dielectric layer(s) 131 opposite the first capacitor electrodes 101. The electronic device may also include an etch-stopping layer 123 (such as a silicon nitride layer) between the insulating layer 109 and the electrodes 101.

As shown in FIG. 1, the spacers 107 may be provided on electrode walls 103 at ends of the electrode walls 103. According to alternate embodiments, however, the electrode walls 103 may extend beyond the spacers. According to additional embodiments, recesses may be provided in the electrode walls 103 adjacent the spacers 107 so that the spacers 107 on thinner portions of the electrode walls do not extend significantly beyond wider portion(s) of the electrode walls. The spacers 107 may reduce the possibility of shorting between first capacitor electrodes 101 if adjacent electrode walls 103 of different electrodes 101 lean together before formation of the capacitor dielectric layer 131 and/or the second capacitor electrode 133. Moreover, spacers 107 could be provided on outside surfaces of the electrode walls 103 without being provided on inside surfaces of the electrode walls 103.

Figure 2A:
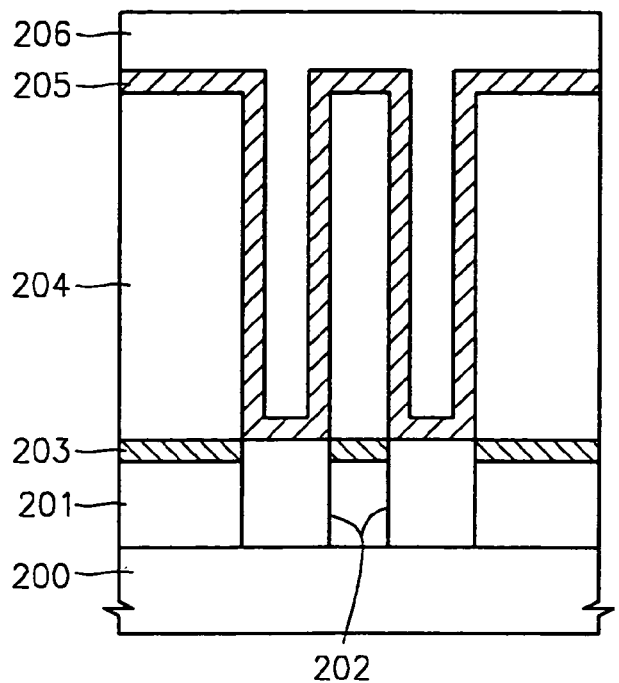
FIGS. 2A-F are cross-sectional views illustrating steps of forming electrodes according to embodiments of the present invention.

Steps of fabricating electrodes according to embodiments of the present invention will now be discussed with reference to FIGS. 2A-F. As shown in FIG. 2A, an insulating layer 201 (such as a silicon oxide layer) may be formed on substrate 200 (such as a silicon substrate), and an etch stopping layer 203 (such as a silicon nitride layer) may be formed on the insulating layer 201. Openings may then be formed through the insulating and etch stopping layers 201 and 203, and conductive plugs 202 (such as polysilicon plugs) may be formed in the openings to provide electrical connection through the insulating layer 201 and the etch stopping layer 203. The conductive plugs 202, for example, may be formed by depositing a polysilicon layer on the etch stopping layer 203 and in openings in the etch stopping layer 203 and the insulating layer 201, and then etching and/or polishing back the polysilicon layer to expose portions of the etch stopping layer 203 while maintaining the polysilicon in the openings in the insulating layer 201.

A first sacrificial layer 204 may be formed on the etch stopping layer 203 and on exposed portions of the conductive plugs 202, and holes though the first sacrificial layer 204 may expose the conductive plugs 202. The sacrificial layer, for example, may be a layer of a material(s) different than a material of the etch stopping layer 203 so that the first sacrificial layer 204 can be selectively removed without significantly removing the etch stopping layer 203. More particularly, the first sacrificial layer 204 may be a layer of an insulating material such as silicon oxide and/or silicon oxynitride. Moreover, the first sacrificial layer may include two or more separately formed layers of the same or different materials.

A conductive layer 205 is then formed on the first sacrificial layer 204 including the holes therein and on the exposed portions of the conductive plugs 202. While not shown in FIG. 2A, the holes in the first sacrificial layer may expose portions of the etch stopping layer 203 adjacent the conductive plugs 202 so that the conductive layer 205 may extend onto exposed portions of the etch stopping layer 203. More particularly, the conductive layer 205 may be a layer of polysilicon having a thickness of approximately 500 Å (Angstroms). A second sacrificial layer 206 may then be formed on the conductive layer 205. The second sacrificial layer 206 may be a layer of an insulating material that can be selectively removed without significantly removing the conductive layer 205 and/or the etch stopping layer 203. While not required, the first and second sacrificial layers 204 and 206 may comprise a same material such as silicon oxide and/or silicon oxynitride.

Figure 2B:
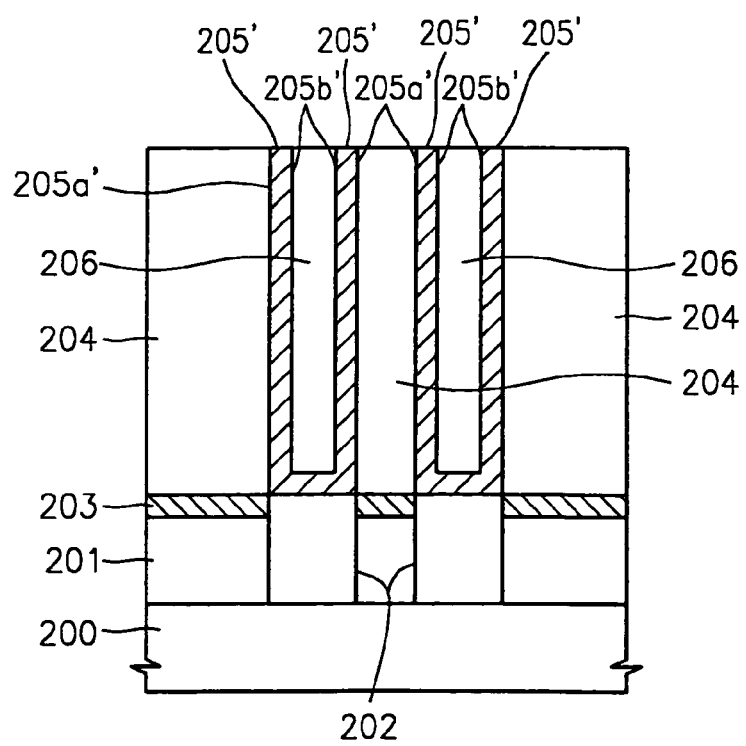

As shown in FIG. 2B, portions of the second sacrificial layer 206 and the conductive layer 205 (opposite the substrate) may be removed (such as by etching and/or polishing back) so that the first sacrificial layer 204 is exposed, and so that portions of the conductive layer 205 in the holes are electrically separated. Accordingly, the remaining portions of conductive layers 205 may define respective electrodes 205' including electrode walls (having outside surfaces 205a' and inside surfaces 205b') extending away from the substrate. Stated in other words, each electrode 205' may include a closed wall defining a cylinder.

Accordingly, the electrode wall outside surfaces 205a' may be formed along sidewalls of the holes in the first sacrificial layer 204, and electrode wall inside surfaces 205b' may be provided along the second sacrificial layer 206'. A geometry of the electrode wall outside surfaces 205a' can thus be defined by the sidewalls of the holes in the first sacrificial layer 204. Accordingly, a hole in the first sacrificial layer having a circular profile may provide an electrode wall outside surface 205a' having a cylindrical profile. As used herein, the term "cylindrical" may include a shape of an electrode wall outside surface 205a' that may result when formed in a circular hole having sloped sidewalls such as may result when an isotropic etch is used to form the holes in the first sacrificial layer 204. Electrodes having other shapes may be provided, for example, by providing holes with different profiles (such as square or rectangular) in the first sacrificial layer.

After removing portions of the second sacrificial layer 206 and the conductive layer 205 as shown in FIG. 2B, the remaining portions of the first sacrificial layer 204 may have a thickness of 20,000 Å or greater. A length of the electrode wall outside surface 205a' may be determined by the thickness of the first sacrificial layer 204 remaining in FIG. 2B. Moreover, portions of the first sacrificial layer 204 may be removed when removing portions of the second sacrificial layer 206 and the conductive layer 205, so that a thickness of the first sacrificial layer 204 in FIG. 2B is less than a thickness of the first sacrificial layer 204 in FIG. 2A. In addition, a thickness of the electrode 205' (between the outside surface 205a' and inside surface 205b') of FIG. 2B may be determined by a thickness of the conductive layer 205 of FIG. 2A.

Figure 2C:
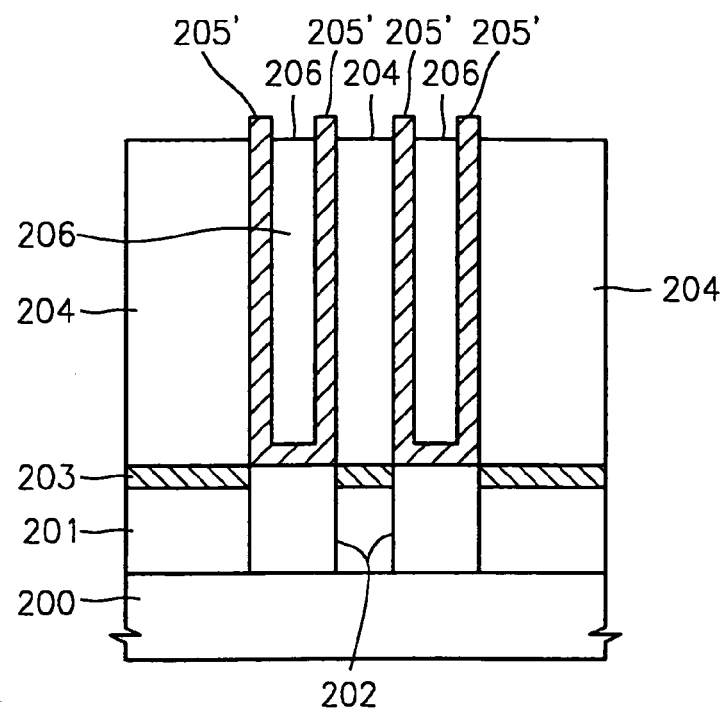

In FIG. 2C, portions of the first sacrificial layer 204 and the second sacrificial layer 206 are removed selectively with respect to the electrodes 205'. Accordingly, portions of the electrodes 205' may extend beyond the first and second sacrificial layers 204 and 206. For example, 200 Å to 500 Å of the first and second sacrificial layers 204 and 205 may be removed so that 200 Å to 500 Å of the outside and inside surfaces 205a' and 205b' of the electrode walls are exposed. The sacrificial layers 204 and 206 may be removed, for example, using a buffered oxide etch (BOE) such as a low ammoniumfluoride liquid (LAL) chemical etch. An LAL etch, for example, may include 2.5 Wt. % HF, 17 Wt. % NH4F, 80.5 Wt. % de-ionized (DI) water, and 400 ppm surfactant.

Figure 2D:
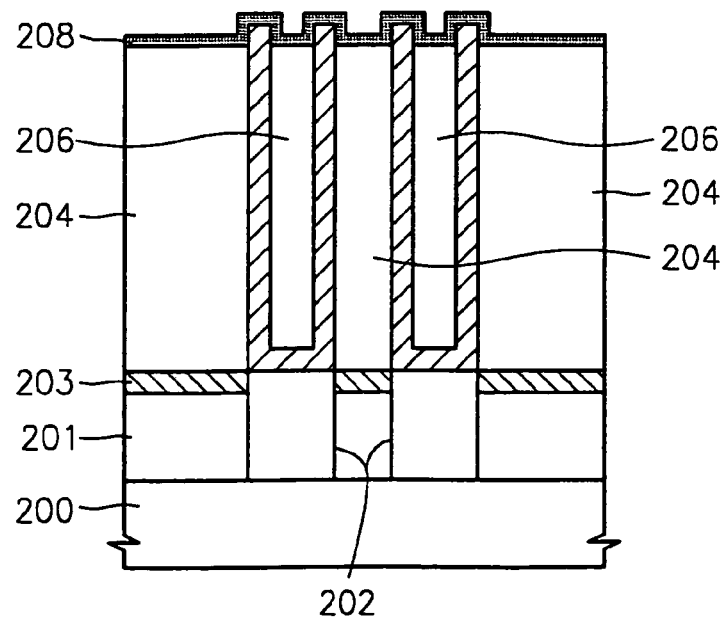
Figure 2E:
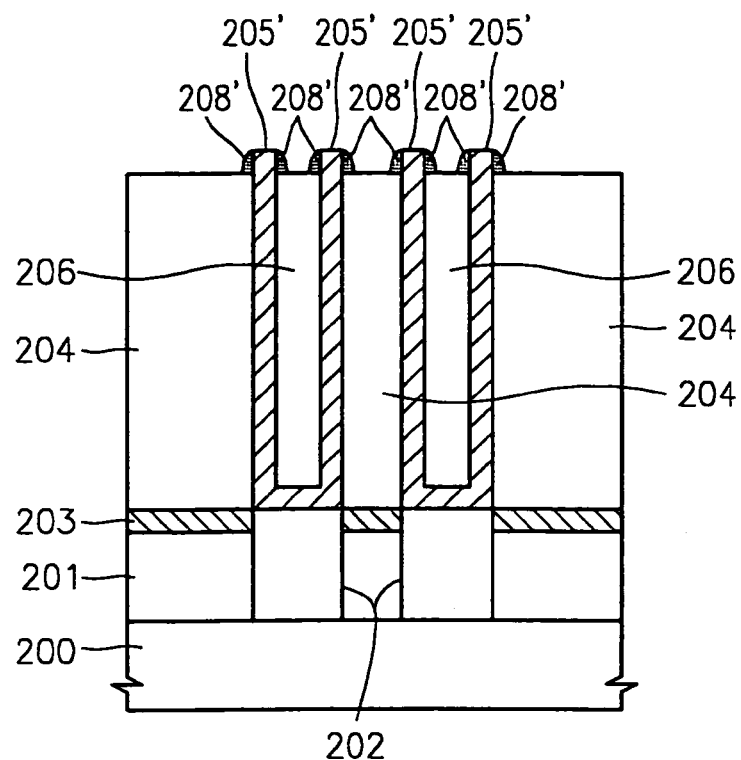

As shown in FIG. 2D, an insulating layer 208 may be formed on the exposed portions of the electrodes 205' and on the first and second sacrificial layers 204 and 206. The insulating layer 208 may be a layer of a material (such as silicon nitride) different than that used for the first and second sacrificial layers 204 and 206 so that the insulating layer 208 may be removed selectively with respect to the first and second sacrificial layers and so that the first and second sacrificial layers 204 and 206 can be removed selectively with respect to the insulating layer 208. The insulating layer 208 can then be subjected to an anisotropic etch to form spacers 208' as shown in FIG. 2E. In particular, the anisotropic etch may be performed for a period of time sufficient to expose portions of the first and second sacrificial layers 204 and 206 while maintaining portions of the insulating layer 208 on the exposed inside and outside surfaces 205a' and 205b' of the electrode walls to provide spacers 208' as shown.

Figure 2F:
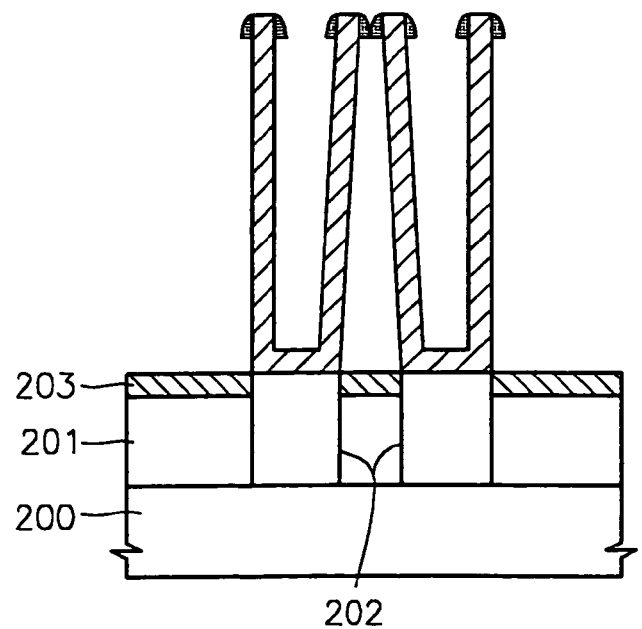

The first and second sacrificial layers 204 and 206 can then be removed as shown in FIG. 2F. More particularly, an etch chemistry may be selected so that the first and second sacrificial layers 204 and 206 are removed selectively with respect to the spacers 208', the electrodes 205', and the etch stopping layer 203. The electrodes 205' may thus be provided with spacers 208' at or near ends thereof. Accordingly, the electrodes 205' may lean together without electrically shorting. The sacrificial layers may be removed using a buffered oxide etch (BOE) such as an LAL chemical etch as discussed above.

A capacitor dielectric layer may then be formed on exposed portions of the electrodes 205', and a second capacitor electrode may be formed on the capacitor dielectric layer opposite the first electrodes 205'. For example, the capacitor dielectric layer may be a layer of a dielectric material such as silicon oxide ($SiO_2$) and/or aluminum oxide ($Al_2O_3$) having a thickness in the range of approximately 30 Å to 50 Å. The capacitor dielectric layer, for example, may be formed by chemical vapor deposition and/or atomic layer deposition. Electrodes 205' of FIG. 2F may thus be used to provide first capacitor electrodes of dynamic random access memory cells. More particularly, the substrate 200 may include respective memory cell access transistors coupled to each of the electrodes 205', and the memory cell access transistors may provide coupling between the electrodes 205' and respective bit lines responsive to read/write signals provided on respective word lines.

Figure 3A:
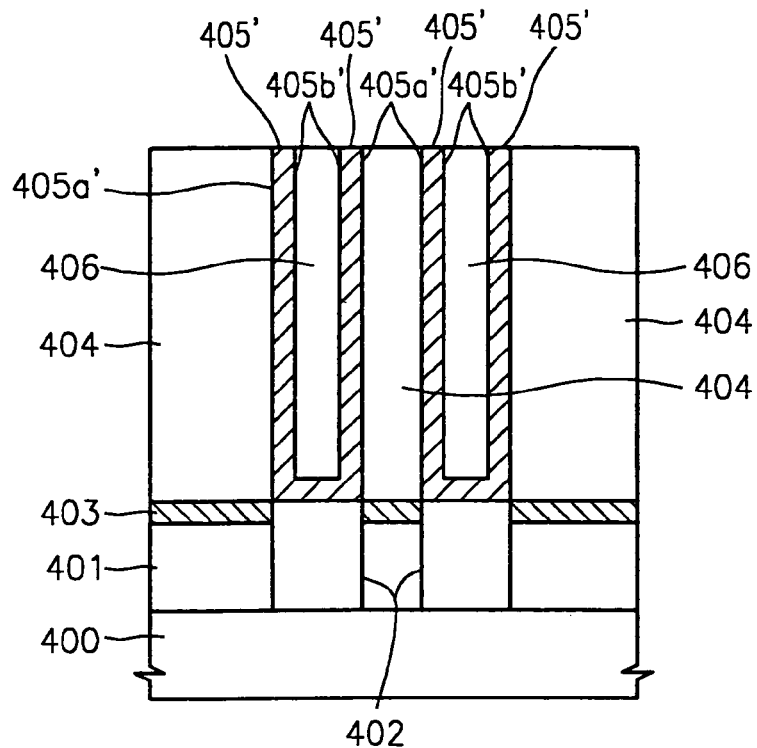
FIGS. 3A-F are cross-sectional views illustrating steps of forming electrodes according to additional embodiments of the present invention.

Steps of fabricating electrodes according to additional embodiments of the present invention will now be discussed with reference to FIGS. 3A-F. As shown in FIG. 3A, an insulating layer 401 (such as a silicon oxide layer) may be formed on substrate 400 (such as a silicon substrate), and an etch stopping layer 403 (such as a silicon nitride layer) may be formed on the insulating layer 401. Openings may then be formed through the insulating and etch stopping layers 401 and 403, and conductive plugs 402 (such as polysilicon plugs) may be formed in the openings to provide electrical connection through the insulating layer 401 and the etch stopping layer 403. The conductive plugs 402, for example, may be formed by depositing a polysilicon layer in openings in the etch stopping layer 403 and the insulating layer 401, and then etching and/or polishing back the polysilicon layer to expose portions of the etch stopping layer while maintaining the polysilicon in the openings in the insulating layer.

A first sacrificial layer 404 may be formed on the etch stopping layer 403 and on exposed portions of the conductive plugs 402, and holes though the first sacrificial layer 404 may expose the conductive plugs 402. The sacrificial layer 404, for example, may be a layer of a material(s) different than a material of the etch stopping layer 403 so that the first sacrificial layer 404 can be selectively removed without significantly removing the etch stopping layer 403. More particularly, the first sacrificial layer 404 may be a layer of an insulating material such as silicon oxide and/or silicon oxynitride. Moreover, the first sacrificial layer 404 may include two or more separately formed layers of the same or different materials.

A conductive layer is then formed on the first sacrificial layer 404 including the holes therein and on the exposed portions of the conductive plugs 402. While not shown in FIG. 3A, the holes in the first sacrificial layer may expose portions of the etch stopping layer 403 adjacent the conductive plugs 402 so that the conductive layer may extend onto exposed portions of the etch stopping layer 403. More particularly, the conductive layer may be a layer of polysilicon having a thickness of approximately 500 Å. A second sacrificial layer 406 may then be formed on the conductive layer. The second sacrificial layer 406 may be a layer of an insulating material that can be selectively removed without significantly removing the conductive layer and/or the etch stopping layer 403. While not required, the first and second sacrificial layers 404 and 406 may comprise a same material such as silicon oxide and/or silicon oxynitride.

As further shown in FIG. 3A, portions of the second sacrificial layer 406 and the conductive layer (opposite the substrate) may be removed (such as by etching and/or polishing back) so that the first sacrificial layer 404 is exposed, and so that portions of the conductive layer in the holes are electrically separated. Accordingly, the remaining portions of the conductive layer may define respective electrodes 405' each including an electrode wall(s) having an outside surface 405a' and an inside surface 405b' extending away from the substrate. Stated in other words, each electrode 405' may be closed so that each electrode wall defines a cylinder. The structure of FIG. 3A may thus be equivalent to that of FIG. 2B.

Accordingly, the electrode wall outside surfaces 405a' may be formed along sidewalls of the holes in the first sacrificial layer 404, and the second sacrificial layer 406' may be provided along electrode wall inside surfaces 405b'. A geometry of the electrode wall outside surfaces 405a' can thus be defined by the sidewalls of the holes in the first sacrificial layer 404. Accordingly, a hole in the first sacrificial layer having a circular profile may provide an electrode wall outside surface 405a' having a cylindrical profile. As used herein, the term "cylindrical" may include a shape of an electrode wall outside surface 405a' that may result when formed in a hole having sloped sidewalls such as may result when an isotropic etch is used to form the holes in the first sacrificial layer 404. Electrodes having other shapes may be provided, for example, by providing holes with different profiles (such as square or rectangular) in the first sacrificial layer.

Figure 3B:
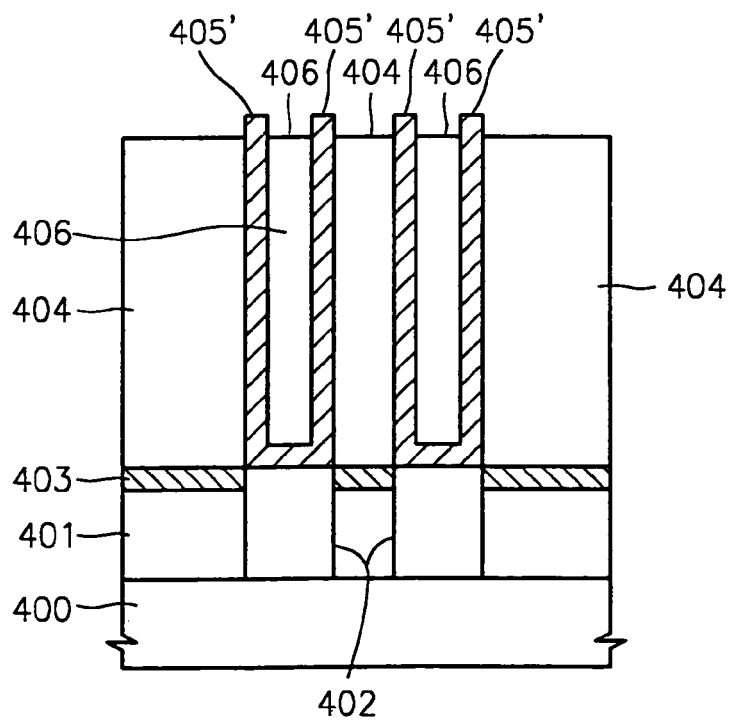

After removing portions of the second sacrificial layer 406 and the conductive layer 405 as shown in FIG. 3B, the remaining portions of the first sacrificial layer 404 may have a thickness of 20,000 Å or greater. A length of the electrode wall outside surfaces 405a' may be determined by the thickness of the first sacrificial layer 404 remaining in FIG. 3B. Moreover, portions of the first sacrificial layer 404 may be removed when removing portions of the second sacrificial layer 406 and the conductive layer 405, so that a thickness of the first sacrificial layer 404 in FIG. 3A is less than a thickness of the originally formed first sacrificial layer 404 in FIG. 3A. In addition, a thickness of the electrode 405' (between the outside surface 405a' and inside surface 405b') of FIG. 3A may be determined by a thickness of the originally formed conductive layer, such as discussed above with respect to FIGS. 2A-B.

In FIG. 3B, portions of the first sacrificial layer 404 and the second sacrificial layer 406 are removed selectively with respect to the electrodes 405'. Accordingly, portions of the electrodes 405' may extend beyond the first and second sacrificial layers 404 and 406. For example, 200 Å to 500 Å of the first and second sacrificial layers 404 and 405 may be removed so that 200 Å to 500 Å of the outside and inside surfaces 405a' and 405b' of the electrode walls are exposed. The sacrificial layers 404 and 406 may be removed, for example, using a buffered oxide etch (BOE) such as a low ammoniumfluoride liquid (LAL) chemical etch. An LAL etch, for example, may include 2.5 Wt. % HF, 17 Wt. % NH4F, 80.5 Wt. % de-ionized (DI) water, and 400 ppm surfactant.

Figure 3C:
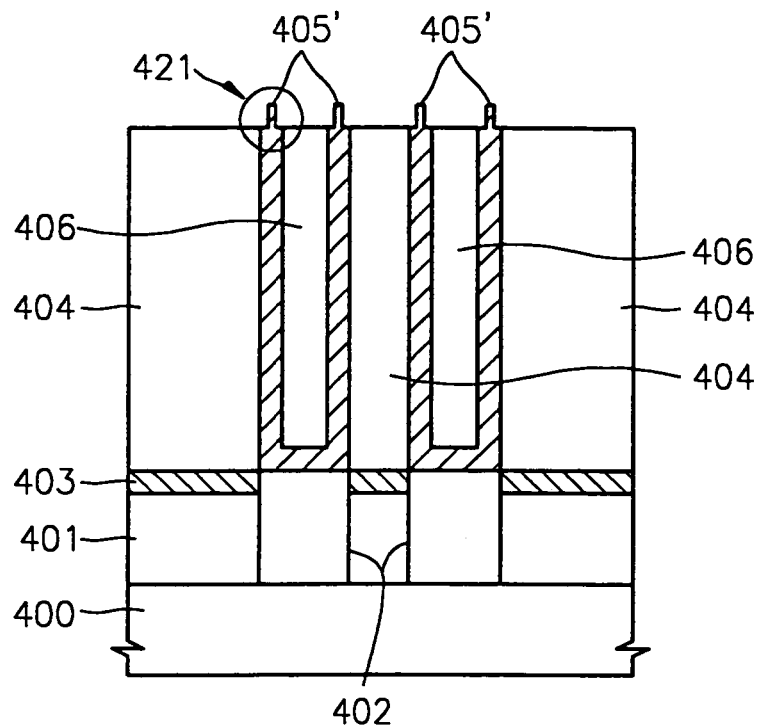

Portions of the electrode wall inside and outside surfaces 405a' and 405b' exposed by removing portions of the sacrificial layers 404 and 406 may then be etched to provide recessed portions of the electrode walls. For example, an isotropic etch may be used that removes the conductive material of the electrodes 405' selectively with respect to the first and second sacrificial layers 404 and 406. More particularly, approximately 150 Å of the exposed portions of the electrodes 405' may be removed so that exposed portions of the electrodes 405' are recessed (at 421, for example) with respect to portions of the electrode 405' protected by the first and second sacrificial layers 404 and 406. Portions of the electrodes 405' protected by the sacrificial layers 404 and 406 may thus maintain a thickness of approximately 500 Å while portions of the electrodes 405' extending beyond the sacrificial layers 404 and 406 may be thinned to approximately 200 Å, as shown in FIG. 3C.

Figure 3D:
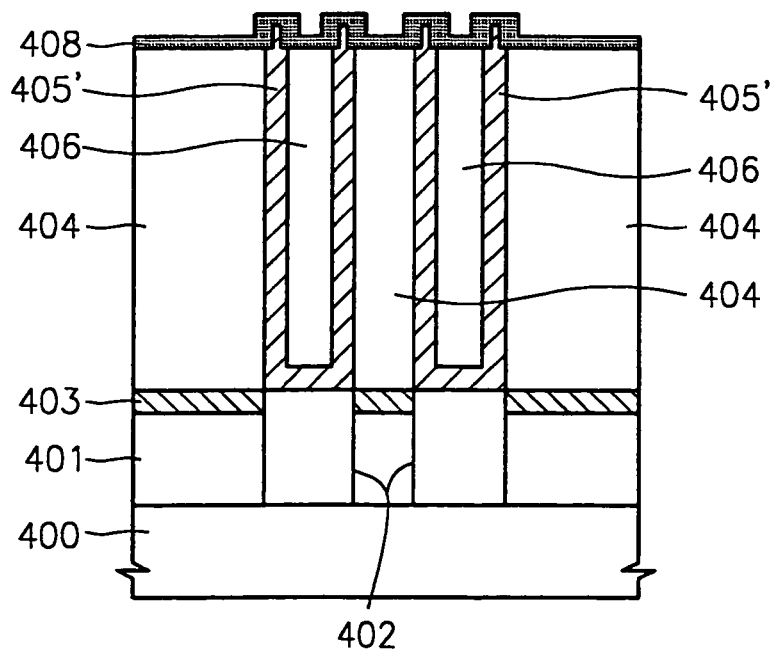
Figure 3E:
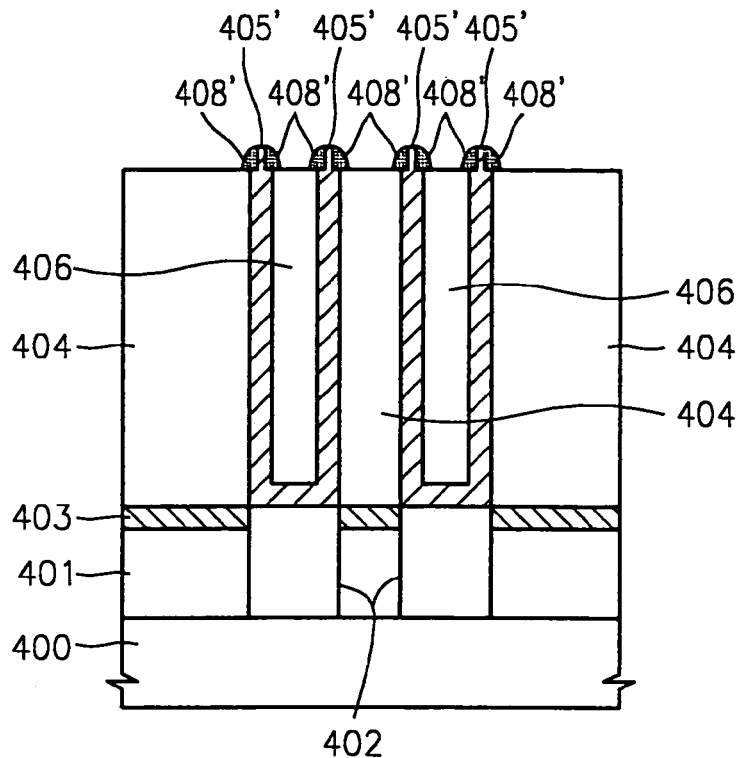

As shown in FIG. 3D, an insulating layer 408 may be formed on the recessed portions of the electrodes 405' and on the first and second sacrificial layers 404 and 406. The insulating layer 408 may be a layer of a material (such as silicon nitride) different than that used for the first and second sacrificial layers 404 and 406 so that the insulating layer 408 may be removed selectively with respect to the first and second sacrificial layers and so that the first and second sacrificial layers 404 and 406 can be removed selectively with respect to the insulating layer 408. The insulating layer 408 can then be subjected to an anisotropic etch to form spacers 408' as shown in FIG. 3E. In particular, the anisotropic etch may be performed for a period of time sufficient to expose portions of the first and second sacrificial layers 404 and 406 while maintaining portions of the insulating layer 408 on the recessed portions of the electrode wall inside and outside surfaces 405a' and 405b' to provide spacers 408'.

Figure 3F:
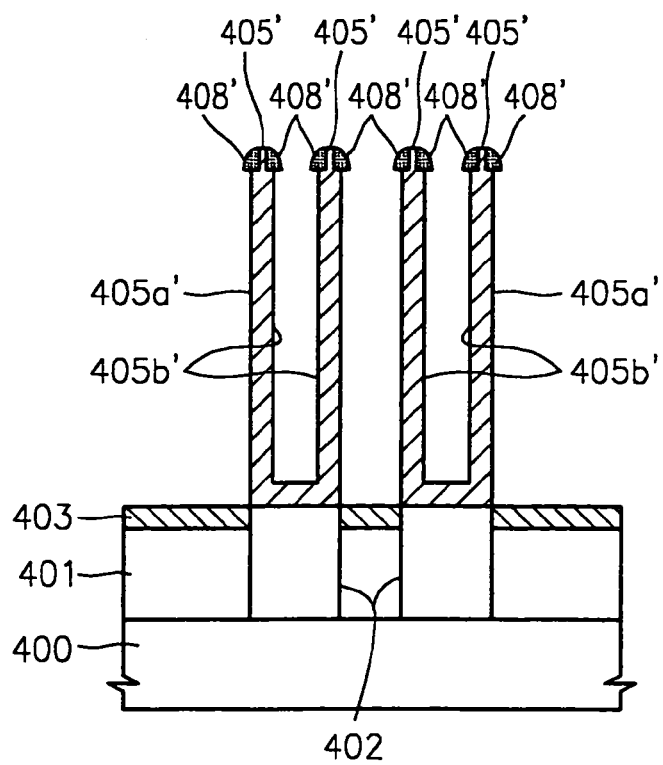

The first and second sacrificial layers 404 and 406 can then be removed as shown in FIG. 3F. More particularly, an etch chemistry may be selected so that the first and second sacrificial layers 404 and 406 are removed selectively with respect to the spacers 408', the electrodes 405', and the etch stopping layer 403. The sacrificial layers may be removed using a buffered oxide etch (BOE) such as an LAL chemical etch as discussed above.

The electrodes 405' may thus be provided with spacers 408' on recessed portions of the electrode wall inside and outside surfaces 405a' and 405b' at or near ends thereof. Accordingly, the electrodes 405' may lean together without electrically shorting. By providing the spacers 408' on recessed portions of the electrodes 405', shadowing of portions of the electrodes 405' (between the spacers and the substrate) may be reduced during subsequent processing steps. Accordingly, subsequent uniformity of depositions (such as depositions of a capacitor dielectric layer and/or a second capacitor electrode) on portions of the electrodes 405' between the spacers 408' and the etch stopping layer 403 may be improved.

A capacitor dielectric layer may then be formed on exposed portions of the electrodes 405', and a second capacitor electrode may be formed on the capacitor dielectric layer opposite the first electrodes 405'. For example, the capacitor dielectric layer may be a layer of a dielectric material such as silicon oxide ($SiO_2$) and/or aluminum oxide ($Al_2O_3$) having a thickness in the range of approximately 30 Å to 50 Å. The capacitor dielectric layer, for example, may be formed by chemical vapor deposition and/or atomic layer deposition. Uniformity of capacitor dielectric layers and/or second capacitor electrodes formed on electrodes 405' of FIG. 3F may thus be improved by providing the spacers 408' on recessed (thinned) portions of the electrodes 405'.

Electrodes 405' of FIG. 3F may thus be used to provide first capacitor electrodes of dynamic random access memory cells. More particularly, the substrate 400 may include respective memory cell access transistors coupled to each of the electrodes 405', and the memory cell access transistors may provide coupling between the first electrodes 405' and respective bit lines responsive to read/write signals provided on respective word lines.

Figure 4A:
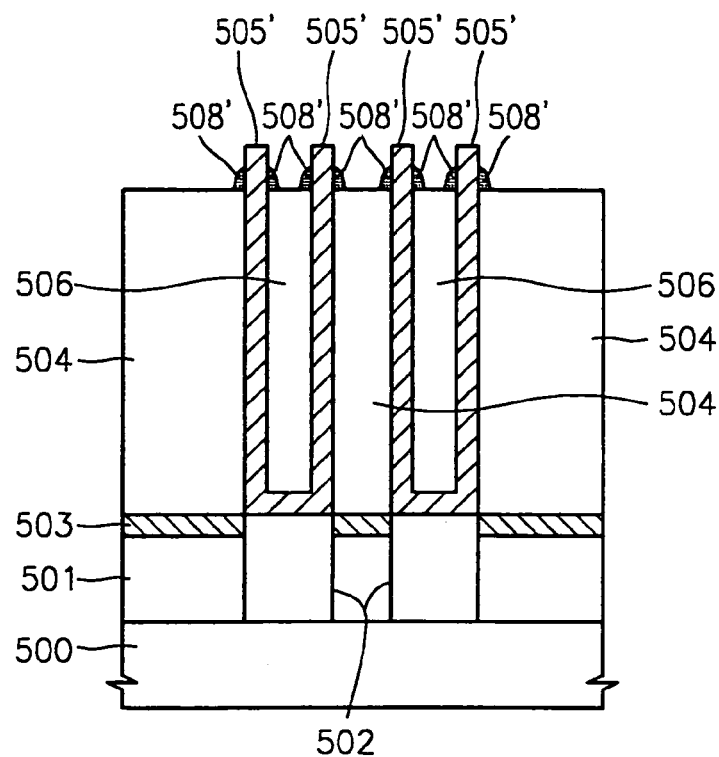
FIGS. 4A-B are cross-sectional views illustrating steps of forming electrodes according to yet additional embodiments of the present invention.
Figure 4B:
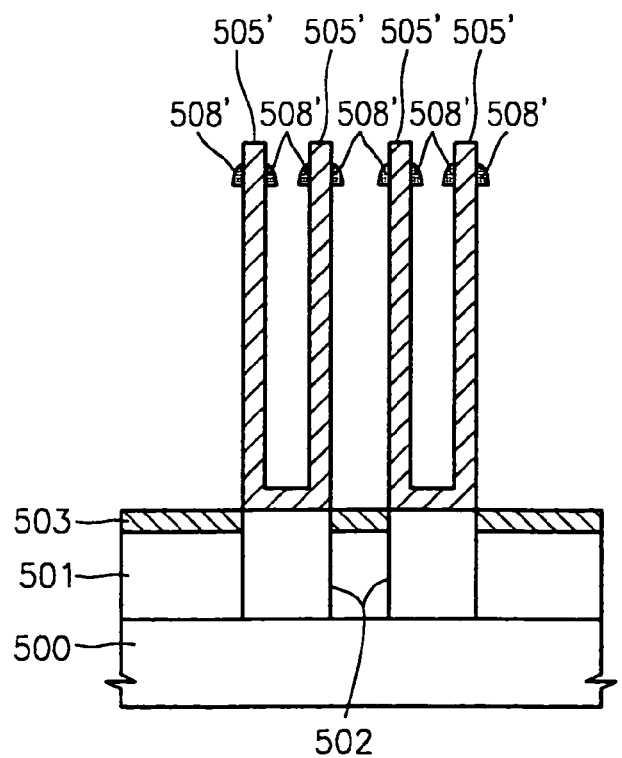

Steps of forming electrodes according to still additional embodiments of the present invention are illustrated in FIGS. 4A-B. The structure illustrated in FIG. 4A can be formed according to steps similar to those discussed above with respect to FIGS. 2A-B, with a difference being that a greater thickness of the sacrificial layers 504 and 506 is removed prior to forming the spacers 508'. As discussed above, the insulating layer 501 (such as a silicon oxide and/or silicon oxynitride layer) and the etch stopping layer 503 (such as a silicon nitride layer) may be formed on substrate 500, and the conductive plugs 502 (such as polysilicon plugs) may be formed in holes through the insulating and etch stop layers 501 and 503.

The first sacrificial layer 504 (such as a layer of silicon oxide and/or silicon oxynitride) may then be formed on the etch stop layer 503 (to a thickness greater than that illustrated in FIG. 4A), and holes in the first sacrificial layer 504 may expose the conductive plugs 502. A conductive layer (such as a polysilicon layer) may be formed on the first sacrificial layer 504 and on sidewalls of the holes therein, and the second sacrificial layer 506 may be formed on the conductive layer to a thickness greater than that illustrated in FIG. 2A. The second sacrificial layer 506 and the conductive layer may then be etched and/or polished back to expose the first sacrificial layer 504 and so that portions of the conductive layer remaining in the holes define electrically isolated electrodes 505'.

After exposing the first sacrificial layer 504, portions of the first and second sacrificial layers 504 and 506 may be selectively removed (with respect to the electrodes 505'), for example, using a buffered oxide etch such as a LAL chemical etch discussed above. Accordingly, portions of the electrodes 505' may be protected by remaining portions of the sacrificial layers 504 and 506 and portions of the electrodes 505' may be exposed. According to embodiments of FIGS. 4A-B, a length of exposed portions of the electrodes 505' may be greater than a length of exposed portions of the electrodes 205' of FIGS. 2C-E.

A layer of an insulating material (such as silicon nitride) may be formed on exposed portions of the electrodes 505' and on remaining portions of the sacrificial layers 504 and 506. The layer of the insulating material may then be subjected to an anisotropic etch to provide the spacers 508' shown in FIG. 4A. As compared to forming the spacers 208' as discussed above with respect to FIGS. 2D-E, a greater etch depth/time may be used to form the spacers of FIG. 4A so that portions of the electrodes 505' extending beyond the sacrificial layers 504 and 506 and beyond the spacers 508' are exposed.

Once the spacers 508' have been formed, the sacrificial layers 504 and 506 can be removed as shown in FIG. 4B. The sacrificial layers may be removed, for example, using a buffered oxide etch such as an LAL chemical etch as discussed above. A capacitor dielectric layer may then be formed on exposed portions of the electrodes 505', and a second capacitor electrode may be formed on the capacitor dielectric layer opposite the electrodes 505'. Relatively long electrodes may be subject to bowing/bending so that electrical contact/shorting therebetween may occur at intermediate portions of the electrodes in addition to or instead of at ends thereof. By placing the spacers at intermediate positions along the electrodes 505', contact between electrodes due to bowing may be reduced. According to embodiments illustrated in FIGS. 4A-B, electrode walls of increased length may be accommodated without electrical shorts therebetween to increase an electrode surface area.

Figure 5A:
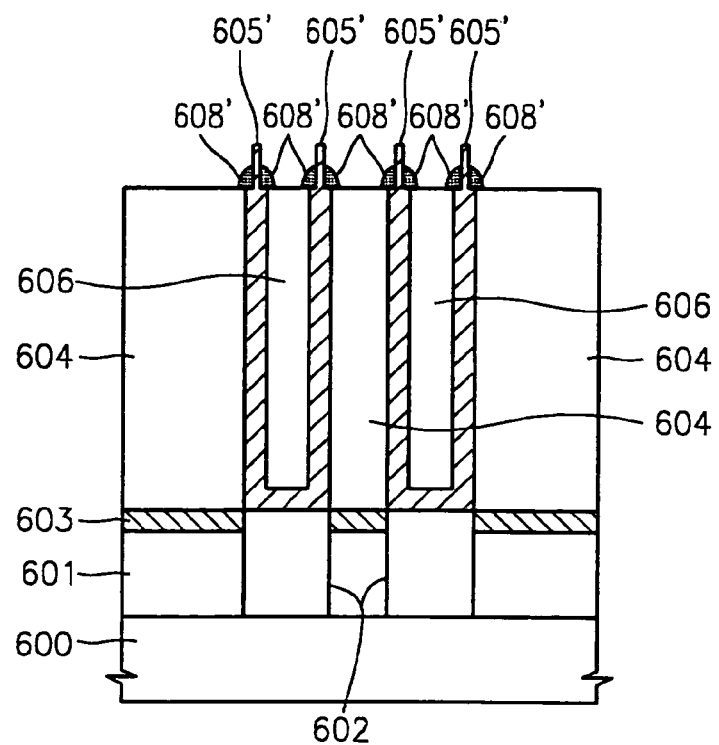
FIGS. 5A-B are cross-sectional views illustrating steps of forming electrodes according to still additional embodiments of the present invention.
Figure 5B:
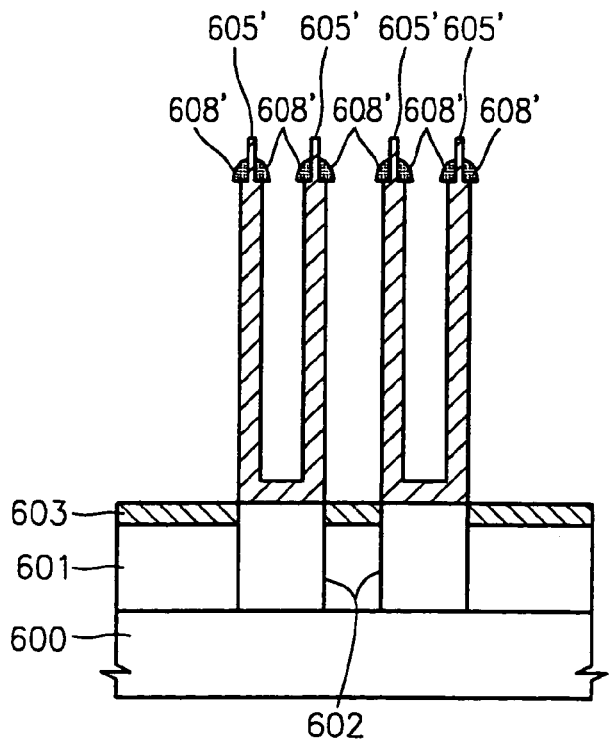
Figure 6A:
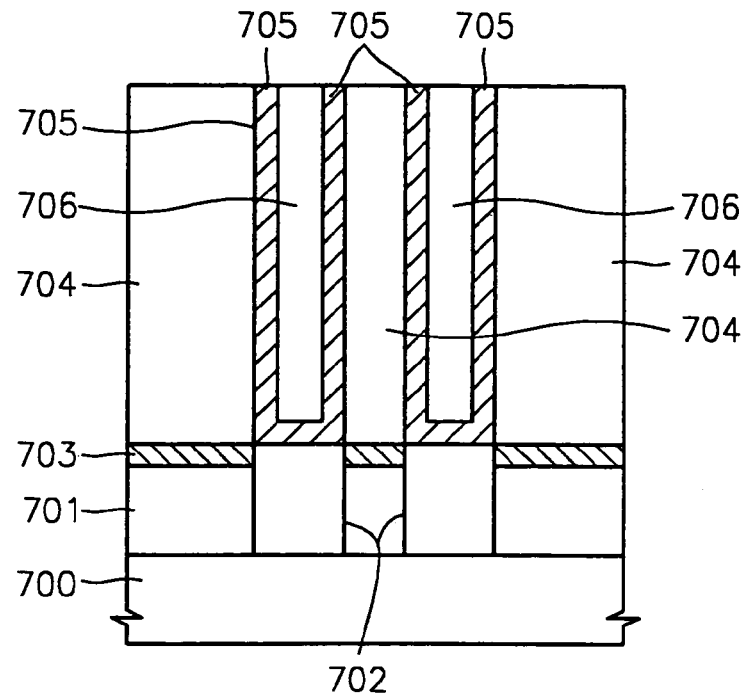
FIG. 6A-B are cross-sectional views illustrating steps of forming electrodes according to the prior art.
Figure 6B:
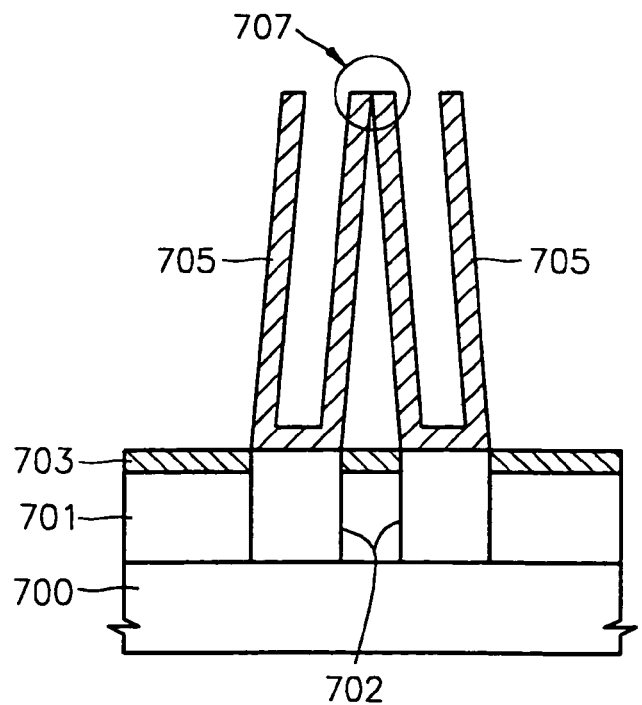

Steps of forming electrodes according to yet additional embodiments of the present invention are illustrated in FIGS. 5A-B. The structure illustrated in FIG. 5A can be formed according to steps similar to those discussed above with respect to FIGS. 3A-B, with a difference being that a greater thickness of the sacrificial layers 604 and 606 is removed prior to forming recessed portions of the electrode walls and forming the spacers 608'. As discussed above, the insulating layer 601 (such as a silicon oxide and/or silicon oxynitride layer) and the etch stopping layer 603 (such as a silicon nitride layer) may be formed on substrate 600, and the conductive plugs 602 (such as polysilicon plugs) may be formed in holes through the insulating and etch stop layers 601 and 603.

The first sacrificial layer 604 (such as a layer of silicon oxide and/or silicon oxynitride) may then be formed on the etch stop layer 603 (to a thickness greater than that illustrated in FIG. 5A), and holes in the first sacrificial layer 604 may expose the conductive plugs 602. A conductive layer (such as a polysilicon layer having a thickness of approximately 500 Å) may be formed on the first sacrificial layer 604 and on sidewalls of the holes therein, and the second sacrificial layer 606 may be formed on the conductive layer to a thickness greater than that illustrated in FIG. 3A. The second sacrificial layer 606 and the conductive layer may then be etched and/or polished back to expose the first sacrificial layer 604 and so that portions of the conductive layer remaining in the holes define electrically isolated electrodes 605' as shown in FIG. 5A.

After exposing the first sacrificial layer 604, portions of the first and second sacrificial layers 604 and 606 may be selectively removed (with respect to the electrodes 605'), for example, using a buffered oxide etch such as a LAL chemical etch discussed above. Accordingly, portions of the electrodes 605' may be protected by remaining portions of the sacrificial layers 604 and 606 and portions of the electrodes 605' may be exposed. According to embodiments of FIGS. 5A-B, a length of exposed portions of the electrodes 605' may be greater than a length of exposed portions of the electrodes 305' of FIGS. 3C-E.

Portions of the electrode wall inside and outside surfaces exposed by the sacrificial layers 604 and 606 may then be etched to provide recessed portions of the electrode walls. For example, an isotropic etch may be used that removes the conductive material of the electrodes 605' selectively with respect to the first and second sacrificial layers 604 and 606. More particularly, approximately 150 Å of the exposed portions of the electrodes may be removed so that exposed portions of the electrodes 605' are recessed with respect to portions of the electrode 605' protected by the sacrificial layers 604 and 606. Portions of the electrodes 605' protected by the sacrificial layers 604 and 606 may thus maintain a thickness of approximately 500 Å while portions of the electrodes 605' extending beyond the sacrificial layers 604 and 606 may be thinned to approximately 200 Å, as shown in FIG. 5A.

A layer of an insulating material (such as silicon nitride) may be formed on exposed portions of the electrodes 605' and on remaining portions of the sacrificial layers 604 and 606. The layer of the insulating material may then be subjected to an anisotropic etch to provide the spacers 608' shown in FIG. 5A. As compared to forming the spacers 608' as discussed above with respect to FIGS. 3D-E, a greater etch depth/time may be used to form the spacers of FIG. 5A so that portions of the electrodes 605' extending beyond the sacrificial layers 604 and 606 and beyond the spacers 608' are exposed.

Once the spacers 608' have been formed, the sacrificial layers 604 and 606 can be removed as shown in FIG. 5B. The sacrificial layers may be removed, for example, using a buffered oxide etch such as an LAL chemical etch as discussed above. A capacitor dielectric layer may then be formed on exposed portions of the electrodes 605', and a second capacitor electrode may be formed on the capacitor dielectric layer opposite the electrodes 605'. Relatively long electrodes may be subject to bowing/bending so that electrical contact/shorting therebetween may occur at intermediate portions of the electrodes in addition to or instead of at ends thereof. By placing the spacers at intermediate positions along the electrodes 605', electrical contact between electrodes due to bowing may be reduced. According to embodiments illustrated in FIGS. 5A-B, electrode walls of increased length may be accommodated without electrical shorts therebetween to increase an electrode surface area. Moreover, by providing the spacers on recessed portions of the electrodes, shadowing of portions of the electrodes (between the spacers and the substrate) can be reduced during subsequent depositions. Accordingly, uniformity of a capacitor dielectric layer formed on the capacitor electrodes may be improved. Stated in other words, by reducing an overhang of the spacers, a shadowing of portions of the electrodes between the spacers and the substrate can be reduced.

While this invention has been particularly shown and described with reference to preferred embodiments thereof, it will be understood by those skilled in the art that various changes in form and details may be made therein without departing from the spirit and scope of the invention as defined by the appended claims.

That which is claimed is:

1. A method for forming an integrated circuit device, the method comprising:
   forming a first conductive electrode on a substrate, the first conductive electrode having an electrode wall extending away from the substrate;
   forming an insulating spacer on the electrode wall wherein portions of the electrode wall are free of the insulating spacer between the substrate and the insulating spacer;
   forming a capacitor dielectric layer on portions of the first conductive electrode free of the spacer; and
   forming a second conductive electrode on the capacitor dielectric layer opposite the first conductive electrode, wherein a thickness of the insulating spacer between the first and second conductive electrodes is greater than a thickness of the capacitor dielectric layer between the first and second conductive electrodes;
   wherein portions of the electrode wall extend beyond the spacer away from the substrate free of the insulating spacer, and wherein the capacitor dielectric layer is also on portions of the electrode wall extending beyond the spacer.

2. A method according to claim 1 wherein the capacitor dielectric layer and the insulating spacer comprise different materials.

3. A method according to claim 1 further comprising:
   forming a transistor on the substrate;
   forming an insulating layer between the substrate and the first conductive electrode; and
   forming a conductive plug providing electrical coupling between the first conductive electrode and a source/drain region of the transistor through the insulating layer.

4. A method of forming an integrated circuit device, the method comprising:
   forming a first conductive electrode on a substrate, the first conductive electrode having an electrode wall extending away from the substrate;
   forming an insulating spacer on the electrode wall wherein portions of the electrode wall are free of the insulating spacer between the substrate and the insulating spacer;
   forming a capacitor dielectric layer on portions of the first conductive electrode free of the spacer; and
   forming a second conductive electrode on the capacitor dielectric layer opposite the first conductive electrode, wherein a thickness of the insulating spacer between the first and second conductive electrodes is greater than a thickness of the capacitor dielectric layer between the first and second conductive electrodes;
   wherein the electrode wall includes a recessed portion and wherein the insulating spacer is on the recessed portion of the electrode wall.

5. A method of forming an electronic device, the method comprising:
   forming a conductive electrode on a substrate, the conductive electrode having an electrode wall extending away from the substrate; and
   forming an insulating spacer on the electrode wall wherein portions of the electrode wall are free of the insulating spacer between the substrate and the insulating spacer;
   wherein portions of the electrode wall extend from the insulating spacer away from the substrate free of the insulating spacer.

6. A method according to claim 5 further comprising:
   forming a capacitor dielectric layer on portions of the conductive electrode free of the spacer.

7. A method according to claim 6 further comprising:
   forming a second conductive electrode on the capacitor dielectric layer opposite the first electrode.

8. A method according to claim 7 wherein the spacer has a first thickness separating the conductive electrodes, wherein the capacitor dielectric layer has a second thickness separating the conductive electrodes, and wherein the first thickness is greater than the second thickness.

9. A method according to claim 5 wherein the electrode wall is closed thereby defining an inside of the wall and an outside of the electrode wall.

10. A method according to claim 9 wherein the electrode wall defines a cylinder.

11. A method according to claim 5 further comprising:
    forming a sacrificial layer on the substrate, the sacrificial layer having a hole therein;
    wherein forming the conductive electrode includes forming the electrode wall on a sidewall of the hole in the sacrificial layer.

12. A method according to claim 11 further comprising:
    removing a portion of the sacrificial layer to expose a portion of the electrode wall while maintaining a portion of the sacrificial layer between the exposed portion of the electrode wall and the substrate.

13. A method according to claim 12 wherein forming the insulating spacer comprises forming the insulating spacer on the exposed portion of the electrode wall.

14. A method according to claim 13 further comprising:
   after forming the insulating spacer, removing portions of the sacrificial layer between the insulating spacer and the substrate.

15. A method according to claim 12 wherein removing a portion of the sacrificial layer comprises removing at least approximately 200 Å of the sacrificial layer.

16. A method according to claim 15 wherein at least approximately 10,000 Å of the sacrificial layer remain after removing at least approximately 200 Å of the sacrificial layer.

17. A method according to claim 16 wherein a length of portions of the electrode between the substrate and the insulating spacer is at least approximately 10,000 Å.

18. A method according to claim 12 wherein the substrate includes a transistor and wherein the conductive electrode is electrically coupled with a source/drain region of the transistor.

19. A method according to claim 12 further comprising:
   forming a sacrificial layer on the substrate wherein the sacrificial layer has a thickness on the substrate such that the sacrificial layer extends to the insulating spacer and wherein the sacrificial layer and the insulating spacer comprise different materials.

20. A method according to claim 11 wherein the sacrificial layer and the insulating spacer comprise different materials.

21. A method of forming an electronic device, the method comprising:
   forming a conductive electrode on a substrate, the conductive electrode having an electrode wall extending away from the substrate; and
   forming an insulating spacer on the electrode wall wherein portions of the electrode wall are free of the insulating spacer between the substrate and the insulating spacer;
   wherein the electrode wall includes a recessed portion and wherein the insulating spacer is formed on the recessed portion of the electrode wall.

22. A method according to claim 21 wherein the recessed portion of the electrode wall extends from the insulating spacer away from the substrate free of the insulating spacer.

23. A method of forming an electronic device, the method comprising:
   forming a conductive electrode on a substrate, the conductive electrode having an electrode wall extending away from the substrate;
   forming a recessed portion at an end of the electrode wall opposite the substrate; and
   forming an insulating spacer on the recessed portion of the electrode wall wherein portions of the electrode wall are free of the insulating spacer between the substrate and the insulating spacer.

24. A method according to claim 23 wherein portions of the electrode wall extend from the insulating spacer away from the substrate free of the insulating spacer.

25. A method according to claim 23 wherein the recessed portion of the electrode wall extends from the insulating spacer away from the substrate free of the insulating spacer.

26. A method according to claim 23 further comprising:
   forming a capacitor dielectric layer on portions of the conductive electrode.

27. A method according to claim 26 further comprising:
   forming a second conductive electrode on the capacitor dielectric layer opposite the first electrode.

28. A method according to claim 27 further comprising:
   forming an insulating spacer on the recessed portion of the electrode wall wherein portions of the electrode wall are free of the insulating spacer between the substrate and the insulating spacer wherein the spacer has a first thickness separating the conductive electrodes, wherein the capacitor dielectric layer has a second thickness separating the conductive electrodes, and wherein the first thickness is greater than the second thickness.

29. A method according to claim 23 wherein the electrode wall is closed thereby defining an inside of the wall and an outside of the electrode wall.

30. A method according to claim 29 wherein the electrode wall defines a cylinder.

31. A method according to claim 23 further comprising:
   forming a sacrificial layer on the substrate, the sacrificial layer having a hole therein;
   wherein forming the conductive electrode includes forming the electrode wall on a sidewall of the hole in the sacrificial layer.

32. A method according to claim 31 further comprising:
   before forming the recessed portion of the electrode wall, removing a portion of the sacrificial layer to expose a portion of the electrode wall while maintaining a portion of the sacrificial layer between the exposed portion of the electrode wall and the substrate.

33. A method according to claim 32 wherein forming the recessed portion of the electrode wall comprises forming the recessed portion of the electrode wall at portions of the electrode wall exposed by the sacrificial layer.

34. A method according to claim 33 further comprising:
   forming an insulating spacer on the recessed portion of the electrode wall wherein the sacrificial layer and the insulating spacer comprise different materials.

35. A method according to claim 33 further comprising:
   after forming the recessed portions of the electrode wall, removing a portion of the sacrificial layer between the recessed portions of the electrode wall and the substrate.

36. A method according to claim 35 wherein removing a portion of the sacrificial layer comprises removing at least approximately 200 Å of the sacrificial layer.

37. A method according to claim 36 wherein at least approximately 10,000 Å of the sacrificial layer remain after removing at least approximately 200 Å of the sacrificial layer.

38. A method according to claim 23 wherein a length of portions of the electrode wall between the substrate and the recessed portion is at least approximately 10,000 Å.

39. A method according to claim 23 wherein the substrate includes a transistor and wherein the conductive electrode is electrically coupled with a source/drain region of the transistor.

* * * * *